United States Patent
Basker et al.

(10) Patent No.: US 9,525,048 B2
(45) Date of Patent: Dec. 20, 2016

(54) SYMMETRICAL EXTENSION JUNCTION FORMATION WITH LOW-K SPACER AND DUAL EPITAXIAL PROCESS IN FINFET DEVICE

(71) Applicant: International Business Machines Corporation, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/748,723

(22) Filed: Jun. 24, 2015

(65) Prior Publication Data

US 2016/0284820 A1    Sep. 29, 2016

Related U.S. Application Data

(63) Continuation of application No. 14/671,115, filed on Mar. 27, 2015, now Pat. No. 9,362,407.

(51) Int. Cl.
*H01L 21/8238* (2006.01)
*H01L 29/66* (2006.01)
*H01L 21/324* (2006.01)

(52) U.S. Cl.
CPC ....... *H01L 29/66795* (2013.01); *H01L 21/324* (2013.01); *H01L 29/66545* (2013.01); *H01L 29/66553* (2013.01)

(58) Field of Classification Search
CPC .......... H01L 21/823431; H01L 21/82382; H01L 21/845; H01L 29/785; H01L 29/41791; H01L 29/66795; H01L 29/66545; H01L 29/66553
See application file for complete search history.

(56) References Cited

U.S. PATENT DOCUMENTS

2015/0104913 A1*   4/2015   Liu ............... H01L 21/823821
                                                      438/229

OTHER PUBLICATIONS

List of Patents or Patent Applications Treated as Related; YOR920140425US2, Date Filed: Jun. 24, 2015, p. 1-2.

(Continued)

*Primary Examiner* — Hoai V Pham
(74) *Attorney, Agent, or Firm* — Cantor Colburn LLP; Vazken Alexanian

(57) ABSTRACT

A technique relates to a dual epitaxial process a device. A first spacer is disposed on a substrate, dummy gate, and hardmask. A first area extends in a first direction from the gate and a second area extends in an opposite direction. A doped intermediate spacer is disposed on the first spacer. A first region is opened on the substrate by removing first spacer and intermediate spacer at the first region. A first epitaxial layer is disposed in the first region. The intermediate spacer is removed from first area. A second spacer is disposed on the intermediate spacer. A second region is opened on the substrate by removing the first spacer, intermediate spacer, and second spacer. A second epitaxial layer is disposed in second region. The width of the second epitaxial layer is enlarged by annealing causing dopant in the intermediate spacer layer to flow into the second epitaxial layer.

10 Claims, 4 Drawing Sheets

(56) References Cited

OTHER PUBLICATIONS

Veeraraghavan S. Basker, et al., "Symmetrical Extension Junction Formation With Low-K Spacer and Dual Epitaxial Process in FinFET Device" U.S. Appl. No. 14/671,115, filed: Mar. 27, 2015.

* cited by examiner

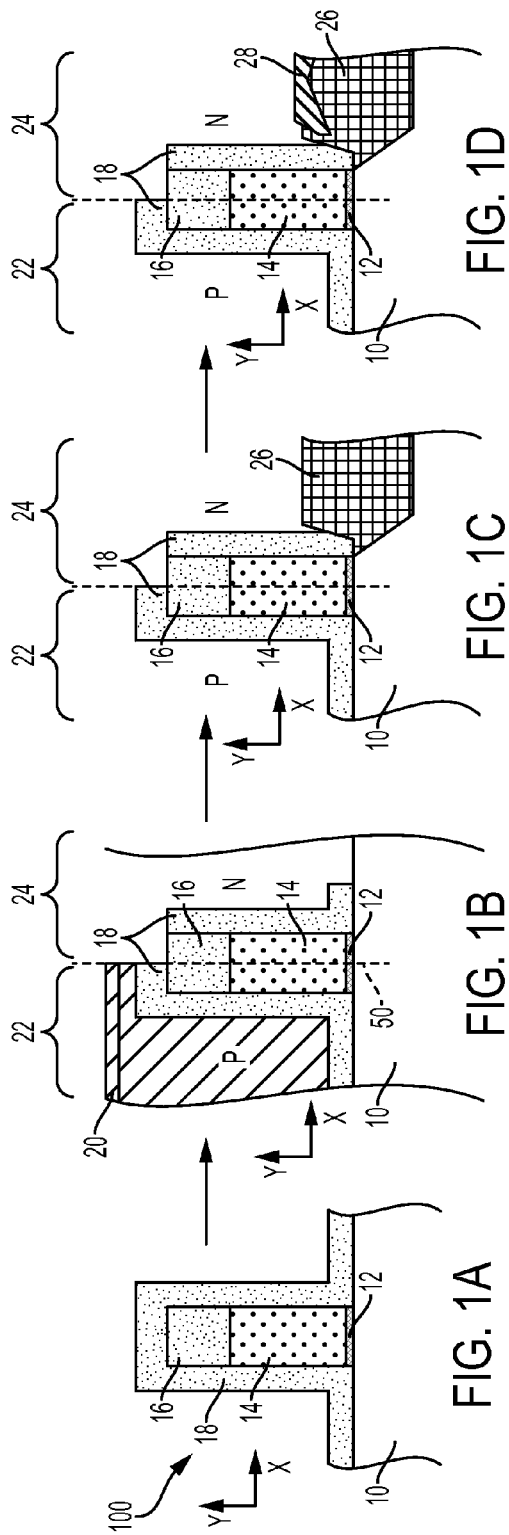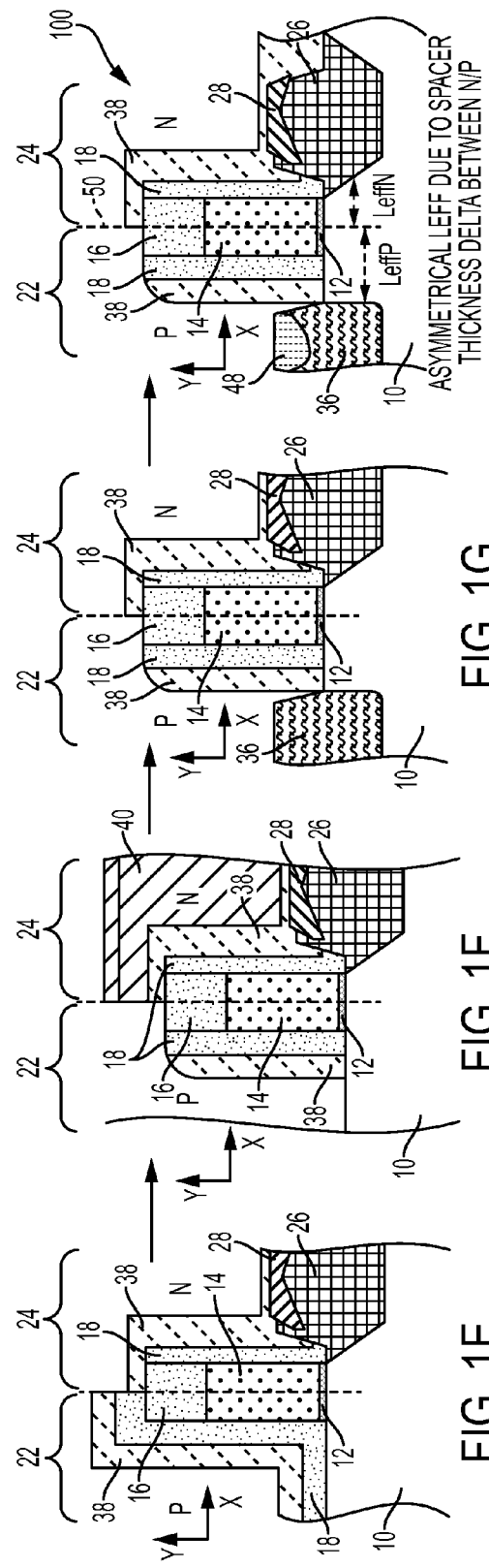

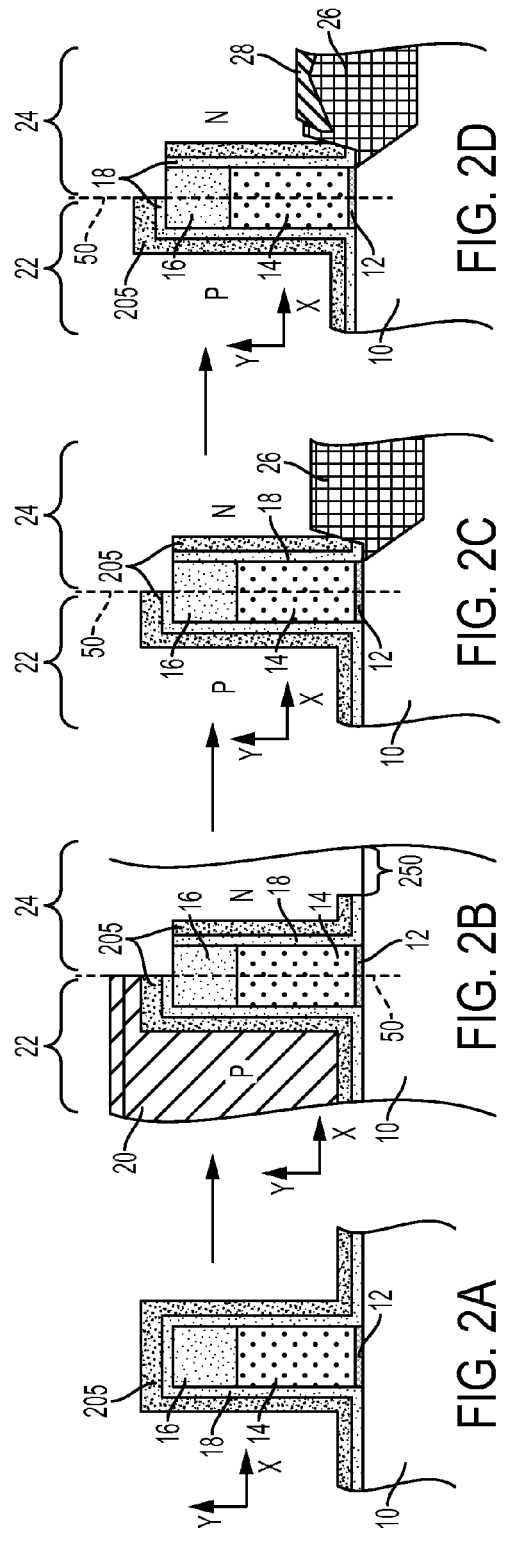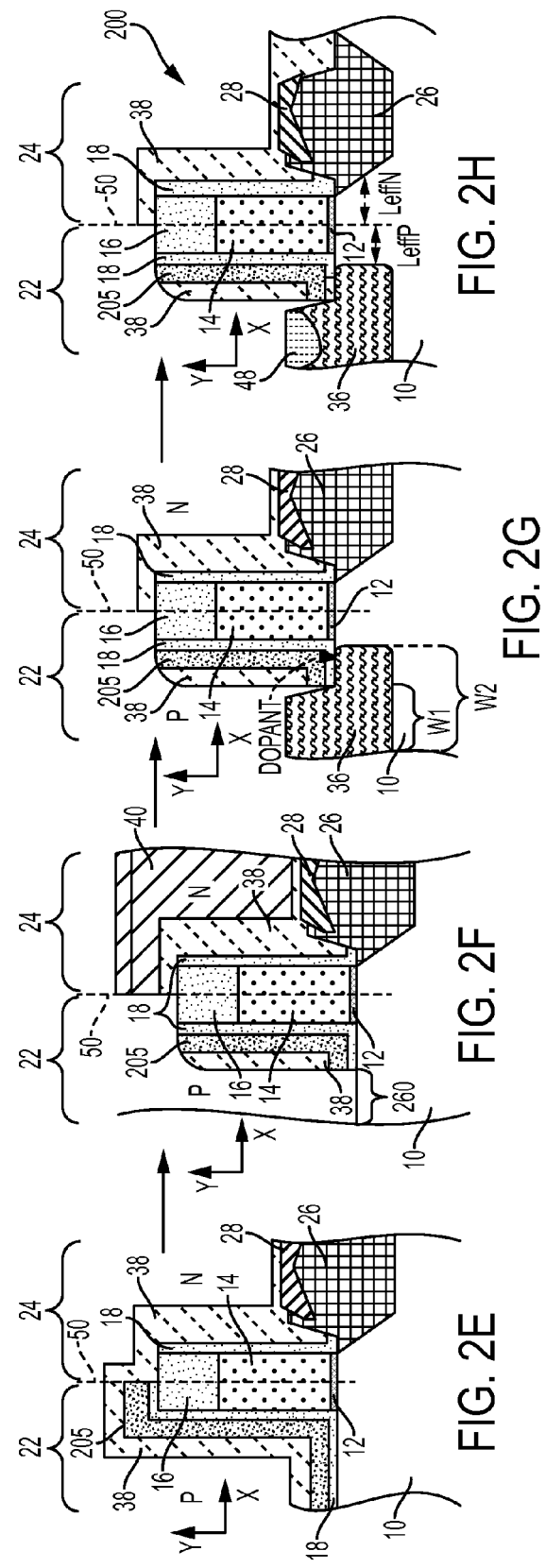

SYMMETRICAL EXTENSION JUNCTION FORMATION WITH LOW-K SPACER AND DUAL EPITAXIAL PROCESS IN FINFET DEVICE

This application is a continuation of U.S. patent application Ser. No. 14/671,115, filed Mar. 27, 2015, the disclosure of which is incorporated by reference herein in its entirety.

BACKGROUND

The present invention relates to semiconductor device manufacturing techniques, and more specifically, to the symmetrical extension junction formation with a low-k spacer and dual epitaxial process in finFET devices.

While the planar field effect transistor (FET) may appear to have reached the end of its scalable lifespan, the semiconductor industry has found an alternative approach with finFETs. FinFET technology is viewed by many as the best choice for next generation advanced processes.

With advanced geometry planar FET technologies, such as 20 nanometer (nm) fabrication, the source and the drain encroach into the channel, making it easier for leakage current to flow between them and in turn making it very difficult to turn the transistor off completely. FinFETs are three-dimensional structures that rise above the substrate and resemble a fin, hence the name. Certain techniques are utilized to form the fins for n-channel FETs and p-channel FETs.

SUMMARY

According to one embodiment, a method of a dual epitaxial process in a finFET device is provided. The method includes disposing a first spacer layer on a substrate, on a dummy gate, and on a hardmask. The first area extends in a first direction from a location on the dummy gate and a second area extends in a second direction from the location on the dummy gate. The first direction is opposite the second direction. An intermediate spacer layer is disposed on top of the first spacer layer, and the intermediate spacer layer includes a dopant. The method includes opening a first region on the substrate by removing the first spacer layer and the intermediate spacer layer at the first region, disposing a first epitaxial layer in the first region on the substrate, removing the intermediate spacer layer from the first area, and disposing a second spacer layer on the intermediate spacer layer. Also, the method includes opening a second region on the substrate by removing the first spacer layer, the intermediate spacer layer, and the second spacer layer at the second region on the substrate, and disposing a second epitaxial layer in the second region on the substrate. The first region and the second region are on opposite sides of the dummy gate. A width of the second epitaxial layer is enlarged by annealing to cause the dopant in the intermediate spacer layer to flow into the second epitaxial layer.

According to one embodiment, a finFET device is provided. A gate is formed on top of a high-k dielectric layer, and the high-k dielectric layer is disposed on a substrate. A first epitaxial layer is disposed on the substrate. A first spacer layer and a second spacer layer are positioned between the gate and the first epitaxial layer relative to a first side of the gate. A second epitaxial layer is disposed on the substrate. The first spacer layer, the second spacer layer, and an intermediate spacer layer are positioned between the gate and the second epitaxial layer relative to a second side of the gate. The intermediate spacer layer includes a dopant that diffuses into the second epitaxial layer during annealing. A width of the second epitaxial layer includes the dopant from the intermediate spacer layer, and the width under the first spacer layer has been enlarged with the dopant from the intermediate spacer layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A through 1H illustrate an exemplary dual epitaxial flow in forming a transistor structure, in which:

FIG. 1A illustrates a high-k dielectric material deposited on a substrate;

FIG. 1B illustrates depositing a block resist mask to protect a PFET area and etching;

FIG. 1C illustrates growing an NFET epitaxial layer;

FIG. 1D illustrates that an n-type dopant may be added to the NFET epitaxial layer;

FIG. 1E illustrates depositing a second spacer layer on top of the transistor structure;

FIG. 1F illustrates depositing a block resist mask to protect the NFET area;

FIG. 1G illustrates growing a PFET epitaxial layer; and

FIG. 1H illustrates adding a p-type dopant to the PFET epitaxial layer;

FIGS. 2A through 2H illustrate a dual epitaxial flow in forming a transistor structure according to an embodiment, in which:

FIG. 2A illustrates a low-k spacer layer covering a first spacer layer;

FIG. 2B illustrates depositing the block resist mask in the PFET area;

FIG. 2C illustrates growing the NFET epitaxial layer;

FIG. 2D illustrates that the low-k spacer layer is stripped from the NFET area;

FIG. 2E illustrates depositing the second spacer layer on top of the transistor structure;

FIG. 2F illustrates depositing a block resist mask to protect the NFET area;

FIG. 2G illustrates growing the PFET epitaxial layer; and

FIG. 2H illustrates that the p-type dopant may be added to the PFET epitaxial layer;

DETAILED DESCRIPTION

Figure 3A:
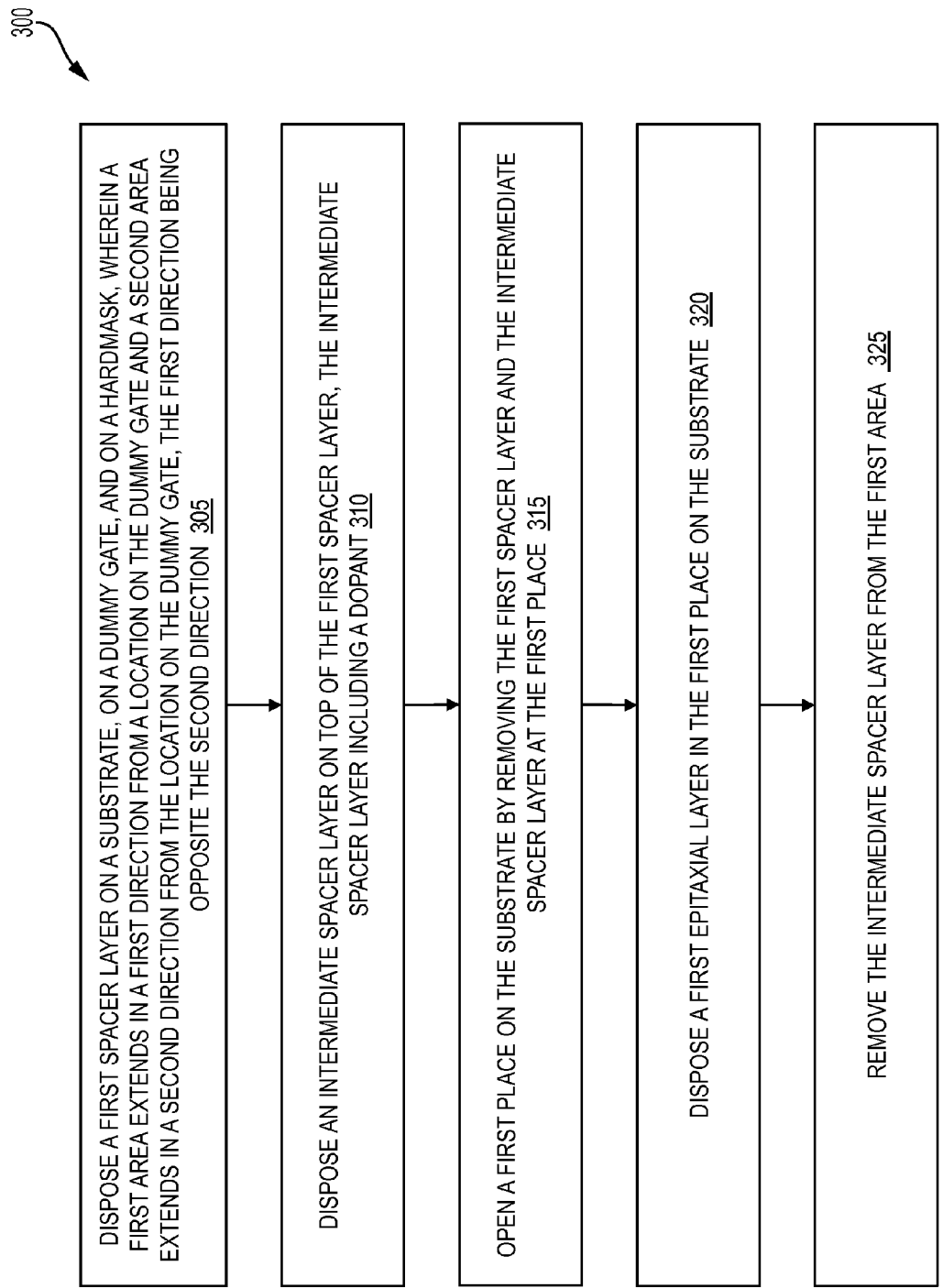
FIGS. 3A and 3B together illustrate a method for a dual epitaxial process in a finFET device according to an embodiment.

Dual spacer and dual epitaxial layers (epi) for n-type (n-channel) field effect transistors (NFET) and p-type (p-channel) field effect transistors (PFET) are utilized to optimize the junction between the n-type and p-type (such as the source/drain) regions, thereby growing the fins (i.e., epitaxial layers) of the finFET device.

FinFET technology features a dual epitaxial layer process for damage-less conformal diffusion during extension junction formation. One issue with the dual epitaxial layer process is epitaxial overburden which causes parasitic capacitance. Embodiments utilize a low-k spacer to address the epitaxial overburden that causes parasitic capacitance in the dual epitaxial layer process.

Another issue in the dual epitaxial layer process is the introduction of block nitride (e.g., 3 nm). The purpose of the block nitride is to block the epitaxial layer formation from either side as its name suggests, such that each epitaxial layer remains on its own side. The dual epitaxial layer process inevitably causes asymmetrical spacer thickness between NFET and PFET making the finFET device design much more challenging.

According to embodiments, a novel structure and method are provided using a low-k intermediate spacer and selective nitride removal. Embodiments also utilize an in-situ (local) epitaxial layer doping technique to form uniform doping in both the NFET and PFET extension region. The insufficient dopant drive-in due to a thicker spacer is compensated for by the supply of p-type dopant (e.g., boron) from the low-k intermediate spacer. The method provides a solution to the asymmetrical extension issue without adding additional masks or process complexity.

Turning to the figures, FIGS. 1A through 1H illustrate an exemplary dual epitaxial flow and potential silicide integration approach in forming a transistor structure 100. FIGS. 1A through 1H show cross-sectional views of forming the transistor structure 100 in accordance with a state-of-the-art process.

FIG. 1A illustrates a high-k dielectric material 12 deposited on a substrate 10. A dummy gate 14 is formed on the high-k dielectric material 12 and a hardmask 16 is formed on top of the high-k dielectric material 12. A first spacer layer 18 is deposited on top of the transistor structure 100.

FIG. 1B illustrates depositing a block resist mask 20 to protect a PFET area 22 and first spacer etching of the first spacer layer 18 in an NFET area 24. Etching the first spacer layer 18 opens up the NFET area 24 on the substrate 10 for further processing while the PFET area 22 is protected by the block resist mask 20. A dashed center line 50 is shown separating the PFET area 22 from the NFET area 24.

FIG. 1C illustrates growing an NFET epitaxial layer 26 which serves as the NFET fin in the finFET transistor structure 100. The block resist mask 20 is removed after depositing the NFET epitaxial layer 26.

As an option, FIG. 1D shows that an n-type dopant 28 may be added to the NFET epitaxial layer 26, which is in preparation for forming silicide. The n-type dopant 28 may be added by ion implantation for example. The n-type dopant introduction is shallow implant and the purpose is to increase the dopant level at the surface where the contact will land so that the contact resistance can be lowered. The silicide will not be formed until after the replacement metal gate (RMG) formation.

FIG. 1E illustrates conformally depositing a second spacer layer 38 on top of the transistor structure 100.

FIG. 1F illustrates depositing a block resist mask 40 to protect the NFET epitaxial layer 26 in the NFET area 24. FIG. 1F shows first and second spacer etching of the first spacer layer 18 and the second spacer layer 38 in the PFET area 22. Etching the first and second spacer layers 18 and 38 opens up substrate 10 in the PFET area 22 in preparation for further processing, while the NFET area 24 is protected by the block resist mask 40.

FIG. 1G illustrates growing a PFET epitaxial layer 36 which serves as the PFET fin in the finFET transistor structure 100. The block resist mask 40 is removed after depositing the PFET epitaxial layer 36.

FIG. 1H shows that a p-type dopant is added to the PFET epitaxial layer 36, followed by forming a silicide 48. The p-type dopant may be added by ion implantation for example.

As can be seen in FIG. 1H, the NFET epitaxial layer 26 extends toward the center line 50 in the x-axis, which is the NFET extension region. The PFET epitaxial layer 36 extends toward the center line 50 in the x-axis (in an opposite direction from the NFET epitaxial layer 26), which is the PFET extension region. An effective channel length (LeffN) is measured from the center line 50 to the closest edge of the NFET epitaxial layer 26 for the NFET area 24. Similarly, an effective channel length (LeffP) is measured from the center line 50 to the closest edge of the PFET epitaxial layer 36 for the PFET area 22. As result of the combined thickness of the first spacer 18 and the second spacer 38 on the sidewalls of the gate 14 for the PFET side 22 being greater than the thickness of the first spacer layer 18 on the sidewalls of the gate 14 for the NFET side 24, the effective channel length LeffP is greater than the effective channel length LeffN. This difference in effective channel lengths can present issues in the transistor structure 100. It is noted that since first spacer layer 38 is formed after the NFET epitaxial layer 26, the "combined thickness" of first and second spacer layers 18 and 38 is moot on the NFET side 24.

FIGS. 2A through 2H illustrate a dual epitaxial flow and potential silicide integration approach in forming a transistor structure 200, in accordance with an exemplary embodiment. FIGS. 2A through 2H (generally referred to as FIG. 2) show cross-sectional views of forming the transistor structure 200. The process in FIG. 2 provides an effective channel length (LeffP) that is equal (or substantially equal) to the effective channel length (LeffN) by compensating for the combined thickness on the sidewalls of the gate 14 for the PFET side 22 (during PFET epitaxial layer 36 formation in FIG. 2G) being greater than the combined thickness of the sidewalls of the gate 14 for the NFET side 24 (during NFET epitaxial layer 26 in FIG. 2C).

Note that some description in FIG. 2 may be similar to FIG. 1. FIG. 2A illustrates the high-k dielectric material 12 deposited on the substrate 10. The substrate may be silicon, germanium, silicon-germanium, etc. The high-k dielectric material 12 may be hafnium oxide. The dummy gate 14 is formed on the high-k dielectric material 12 and the hardmask layer 16 is formed on top of the high-k dielectric material 12. The dummy gate material 14 may be polysilicon. The hardmask layer 16 may be silicon nitride, titanium nitride, etc.

The first spacer layer 18 is deposited on top of the transistor structure 100. The first spacer layer 18 may be a nitride. The thickness of the first spacer layer 18 may be in the range of 8-10 nm. The thickness of the first spacer layer 18 in FIG. 2A is smaller than the thickness in FIG. 1A.

Additionally, a low-k intermediate spacer layer 205 is deposited on top of the transistor structure 200, which low-k material also includes a dopant. The low-k spacer layer 205 may be a nitride that includes a p-type dopant utilized to reduce the effective channel length (LeffP) as measured from the edge of the PFET epitaxial layer 36 to the center line 50 in FIG. 2. In one case, the material of the low-k spacer layer 205 may be silicon carbon boron nitride (SiCBN). The low-k spacer layer 205 is doped with boron and carbon. The carbon reduces the k-value and thus reduces the capacitance in the transistor device 200. The boron is a p-type dopant that is utilized to reduce the effective channel length (LeffP) such that the effective channel length (LeffP) equals or substantially equals the effective channel length (LeffN). Another example material of the low-k spacer layer 205 may include SiOCN.

FIG. 2B shows the dashed center line 50 which separates the PFET area 22 from the NFET area 24. FIG. 2B illustrates depositing the block resist mask 20 to protect the PFET area 22, and the protected PFET area 22 includes the low-k spacer layer 205, the first spacer layer 18, part of the hardmask 16, and part of the dummy gate 14. FIG. 2B shows etching of the first spacer layer 18 and low-k spacer layer 205 in the NFET area 24. Etching the first spacer layer 18 and low-k spacer layer 205 opens up an NFET region 250 on the substrate 10 in the NFET area 24 for further processing while the PFET area 22 remains protected by the block resist mask 20.

FIG. 2C illustrates growing the NFET epitaxial layer 26 which serves as the NFET fin in the finFET transistor structure 200. The NFET epitaxial layer 26 is in-situ doped with an n-type dopant, such as phosphorus. The NFET epitaxial layer 26 layer may be silicon germanium (SiGe), silicon, etc., in-situ doped with the n-type dopant (e.g., phosphorus). The doped area 26 has dopants that diffuse toward the channel under the gate 14 during subsequent thermal process. The block resist mask 20 is removed after depositing the NFET epitaxial layer 26.

FIG. 2D shows that the low-k spacer layer 205 is stripped from the NFET area 24, such that the low-k spacer layer 205 is removed from being on the first spacer layer 18. Additionally, FIG. 2D optionally shows that the n-type dopant 28 may be added to the NFET epitaxial layer 26, in preparation for later forming the silicide. In one case, the n-type dopant may be added by ion implantation. The n-type dopant may be phosphorus. The p-type dopant introduction is shallow implant and the purpose is to increase the dopant level at the surface where the contact will land so that the contact resistance can be lowered. The silicide will not be formed until after the replacement metal gate (RMG) formation.

FIG. 2E illustrates depositing the second spacer layer 38 on top of the transistor structure 100. Particularly, the second spacer layer 38 is deposited on top of the low-k spacer layer 205 in the PFET area 22. In the NFET area 24, the second spacer layer 38 is deposited on top of the first spacer layer 18, on top of the hardmask 16, and on top of the NFET epitaxial layer 26.

FIG. 2F illustrates depositing a block resist mask 40 to protect the NFET area 24, which already has the NFET epitaxial layer 26 deposited. FIG. 2F shows etching of the first spacer layer 18, the low-k spacer layer 205, and the second spacer layer 38 in the PFET area 22. Etching the first spacer layer 18, low-k spacer layer 205, and second spacer layer 38 opens up a PFET region 260 on the substrate 10 in the PFET area 22 in preparation for further processing, while the NFET area 24 is protected by the block resist mask 40.

FIG. 2G illustrates growing the PFET epitaxial layer 36 which serves as the PFET fin in the finFET transistor structure 200. The PFET epitaxial layer 36 is in situ doped with a p-type dopant, such as boron. The PFET epitaxial layer 36 layer may be silicon germanium (SiGe), silicon, etc., in situ doped with the p-type dopant (e.g., boron).

The low-k spacer layer 205 is also doped with a p-type dopant (which may be boron). Therefore, the transistor structure 200 is annealed to drive the p-type dopant (e.g., boron) from the doped low-k intermediate spacer layer 205 into the PFET epitaxial layer 36, which causes the PFET epitaxial layer 36 to extend closer (i.e., widen in the x-axis) toward the center line 50 than when no low-k spacer layer 205 is utilized. By having the low-k spacer layer 205 doped with the p-type dopant and annealing the transistor structure 200, the PFET epitaxial layer 36 may extend in the range of 3-5 nm closer to the center line 50 than when a regular non-doped spacer is utilized. For example, without the low-k intermediate spacer layer 205, the PFET epitaxial layer 36 may have a first width "w1" in the x-axis. However, by utilizing the low-k intermediate spacer layer 205 and annealing to diffuse the p-type dopant into the PFET epitaxial layer 36, the width "w1" is enlarged to width "w2" in the x-axis. The width "w2" is larger than the width "w1". The block resist mask 40 is removed after depositing the PFET epitaxial layer 36.

FIG. 2H shows that the p-type dopant may be further added to the PFET epitaxial layer 36, followed by forming the silicide 48. The p-type dopant, e.g., boron, may be added by ion implantation. As can be seen in FIG. 2H, the NFET epitaxial layer 26 extends toward the center line 50 in the x-axis, which is the NFET extension region. Similarly, the PFET epitaxial layer 36 extends toward the center line 50 in the x-axis (in an opposite direction from the NFET epitaxial layer 26), which is the PFET extension region. Again, the effective channel length (LeffN) is measured from the center line 50 to the edge of the NFET epitaxial layer 26 for the NFET area 24, while the effective channel length (LeffP) is measured from the center line 50 to the edge of the PFET epitaxial layer 36 for the PFET area 22.

However, in contrast to FIG. 1H, FIG. 2H shows that the effective channel length (LeffP) in the PFET area 22 is equal to and/or substantially equal to the effective channel length (LeffN) in the NFET area 24 because of the diffusion of p-type dopant (boron) that expands the extension of the PFET epitaxial layer 36 (i.e., enlarging from width "w1" to "w2"). Expanding the extension of the PFET epitaxial layer 36 toward the center line 50 correspondingly reduces the distance of the effective channel length LeffP. Accordingly, the effective channel length (LeffP) is no longer asymmetrical with respect to the effective channel length (LeffN). In other words, the LeffP equals and/or is about equal to LeffN.

Figure 3B:
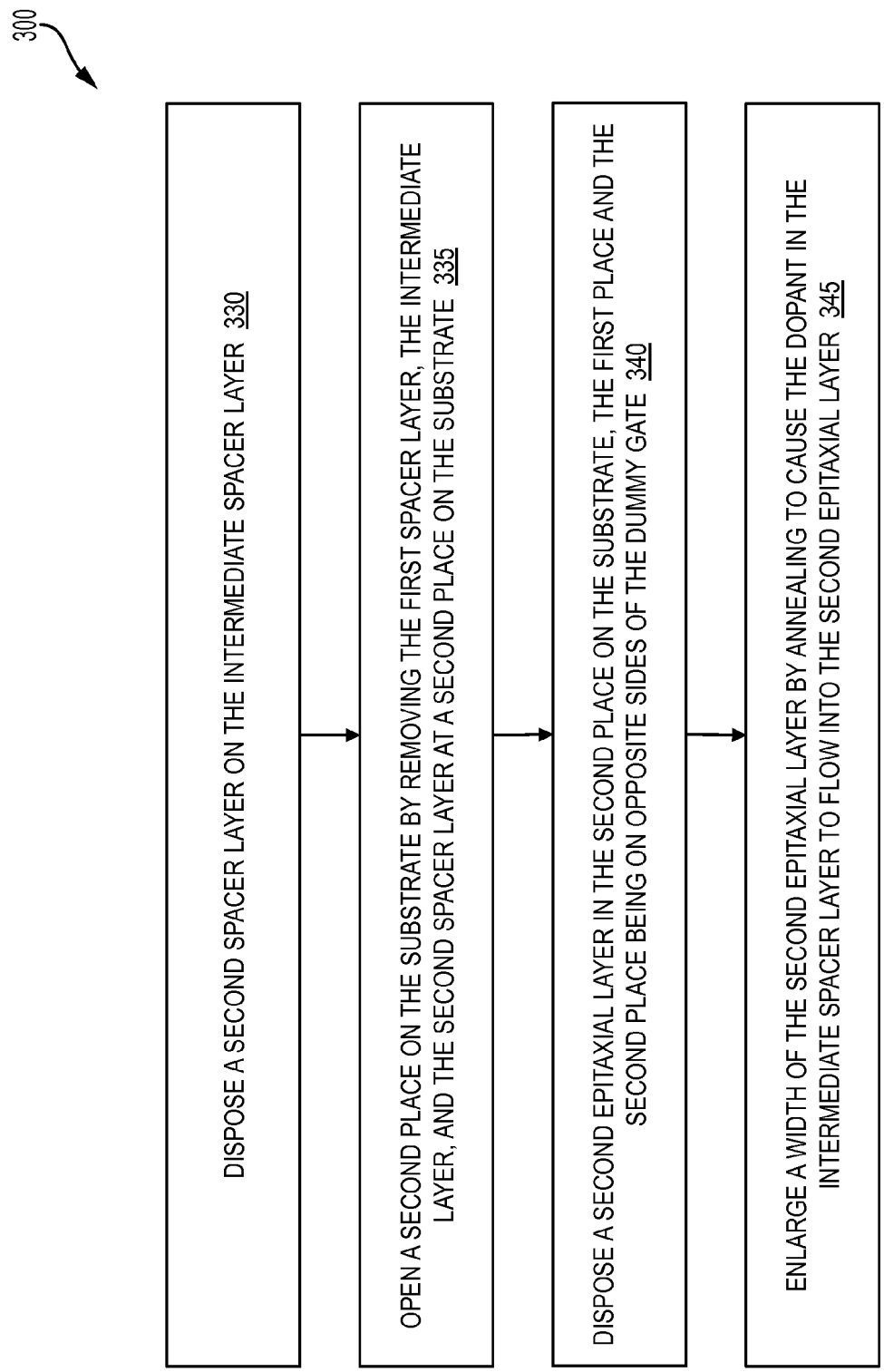

FIGS. 3A and 3B illustrate a method 300 of a dual epitaxial process in a finFET device according to an embodiment. Reference can be made to FIGS. 1 and 2.

At block 305, the first spacer layer 18 is disposed on top of substrate 10, on top of the dummy gate 14, and on top of the hardmask 16, such that a first area (e.g., NFET area 24) extends in a first direction (on the x-axis) from a location (center line 50) on the dummy gate 14 and a second area (e.g., PFET area 22) extends in a second direction (opposite direction on the x-axis) from the location (center line 50) on the dummy gate 14. The first direction is opposite the second direction on the x-axis.

At block 310, the intermediate spacer layer 205 is disposed on top of the first spacer layer 18, and the intermediate spacer layer 205 includes a dopant.

At block 315, the first region (e.g., NFET opening region 250 on substrate 10 for the NFET in NFET area 24) is opened on the substrate 10 by removing the first spacer layer 18 and the intermediate spacer layer 205 at the first region 250.

At block 320, the first epitaxial layer (e.g., NFET epitaxial layer 26) is disposed in the first region 250 on the substrate 10. The intermediate spacer layer 205 is removed from the first area (e.g., NFET area 24) at block 325.

At block 330, the second spacer layer 38 is disposed on top of the intermediate spacer layer 205 (e.g., in the PFET area 22). The second spacer layer 38 is also disposed on top of the hardmask 16, the sides of the dummy gate 14, and on top of the first epitaxial layer (e.g., NFET epitaxial layer 26).

At block 335, a second region (e.g., PFET opening region 260) on substrate 10 for the PFET in PFET area 22) is opened on the substrate 10 by removing the first spacer layer 18, the intermediate layer 205, and the second spacer layer 38 at the second region 260 on the substrate 10.

At block 340, the second epitaxial layer (e.g., PFET epitaxial layer 36) in the second region (e.g., PFET opening region 260) on the substrate 10, in which the first region 250 and the second region 260 are on opposite sides of the dummy gate 14 (e.g., opposite dies of the center line 50).

At block 345, a width of the second epitaxial layer (e.g., PFET epitaxial layer 36) is enlarged by annealing the transistor structure 200 to cause the dopant in the intermediate spacer layer 205 to flow into the second epitaxial layer (e.g., PFET epitaxial layer 36).

The intermediate spacer layer 205 is a low-k dielectric material. The intermediate spacer layer includes carbon. The carbon causes the intermediate spacer layer 205 to be a low-k dielectric, such that the low-k dielectric reduces parasitic capacitance in the finFET device 200. The high-k dielectric layer 12 is sandwiched between the dummy gate 14 and the substrate 10.

The first epitaxial layer is doped in situ, and the second epitaxial layer is doped in situ.

The width "w2" of the second epitaxial layer is enlarged according to at least one of a length of time for annealing the transistor structure 200 causing the dopant to flow from the intermediate spacer layer 205 and/or a dopant concentration of the dopant in the intermediate spacer layer 205. A higher concentration of the dopant causes a larger width of the second epitaxial layer (e.g., PFET epitaxial layer 36).

A first effective channel length (e.g., effective channel length LeffN for the NFET area 24) corresponding to the first epitaxial layer is substantially equal to a second channel length (e.g., effective channel length LeffP for the PFET area 22) corresponding to the second epitaxial layer.

The first epitaxial layer in the first region corresponds to the NFET area 24, and the second epitaxial layer in the second region corresponds to the PFET area 22.

A first distance of the first spacer layer 18 and the second spacer layer 38 positioned between the gate 14 and the first epitaxial layer 26 relative to the first side of the gate 30 (e.g., in the NFET area 24) is less than a second distance of the first spacer layer 18, the second spacer layer 38, and the intermediate spacer layer 205 positioned between the gate 30 and the second epitaxial layer 36 relative to the second side (e.g., the PFET area 22) of the gate 30.

Although examples discuss enlarging the PFET epitaxial layer 36 by utilizing the low-k intermediate spacer layer 205 with a p-type dopant, embodiments are not meant to be limited to only enlarging the width of the PFET epitaxial layer 36. Analogously, the NFET epitaxial layer 26 may be enlarged by utilizing the low-k intermediate spacer layer 205 with an n-type dopant. The teachings of the disclosure can be modified for enlarging the NFET epitaxial layer 26 as would be understood by one skilled in the art.

It will be noted that various semiconductor device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of a dual epitaxial process in a finFET device, the method comprising:
   disposing a first spacer layer on a substrate, on a dummy gate, and on a hardmask, wherein a first area extends in a first direction from a location on the dummy gate and a second area extends in a second direction from the location on the dummy gate, the first direction being opposite the second direction;
   disposing an intermediate spacer layer on top of the first spacer layer, the intermediate spacer layer including a dopant;
   opening a first region on the substrate by removing the first spacer layer and the intermediate spacer layer at the first region;
   disposing a first epitaxial layer in the first region on the substrate;
   removing the intermediate spacer layer from the first area;
   disposing a second spacer layer on the intermediate spacer layer;
   opening a second region on the substrate by removing the first spacer layer, the intermediate spacer layer, and the second spacer layer at the second region on the substrate;

disposing a second epitaxial layer in the second region on the substrate, the first region and the second region being on opposite sides of the dummy gate; and enlarging a width of the second epitaxial layer by annealing to cause the dopant in the intermediate spacer layer to flow into the second epitaxial layer.

2. The method of claim 1, wherein the intermediate spacer layer is a low-k dielectric material.

3. The method of claim 1, wherein the intermediate spacer layer includes carbon.

4. The method of claim 3, wherein the carbon causes the intermediate spacer layer to be a low-k dielectric, the low-k dielectric reducing parasitic capacitance in the finFET device.

5. The method of claim 1, wherein a high-k dielectric layer is sandwiched between the dummy gate and the substrate.

6. The method of claim 1, wherein the first epitaxial layer is doped in situ.

7. The method of claim 1, wherein the second epitaxial layer is doped in situ.

8. The method of claim 1, wherein the width of the second epitaxial layer is enlarged according to at least one of a length of time for annealing and a concentration of the dopant in the intermediate spacer layer.

9. The method of claim 1, wherein a first effective channel length corresponding to the first epitaxial layer is substantially equal to a second channel length corresponding to the second epitaxial layer.

10. The method of claim 1, wherein the first epitaxial layer in the first region corresponds to an NFET area; and wherein the second epitaxial layer in the second region corresponds to a PFET area.

* * * * *